US012802728B2

(12) United States Patent
Won et al.

(10) Patent No.: US 12,802,728 B2
(45) Date of Patent: Nov. 17, 2026

(54) SEMICONDUCTOR DEVICE HAVING A THREE-DIMENSIONAL STRUCTURE INCLUDING CAPACITORS AND CELL TRANSISTORS

(71) Applicant: SK hynix Inc., Gyeonggi-do (KR)

(72) Inventors: Hyung Sik Won, Gyeonggi-do (KR); Seung Hwan Kim, Gyeonggi-do (KR); Jun Ho Cheon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 246 days.

(21) Appl. No.: 18/545,370

(22) Filed: Dec. 19, 2023

(65) Prior Publication Data

US 2025/0069630 A1 Feb. 27, 2025

(30) Foreign Application Priority Data

Aug. 25, 2023 (KR) ........................ 10-2023-0112026

(51) Int. Cl.
*G11C 7/18* (2006.01)
*G11C 5/06* (2006.01)

(52) U.S. Cl.
CPC ................ *G11C 7/18* (2013.01); *G11C 5/063* (2013.01)

(58) Field of Classification Search
CPC .................................. G11C 7/18; G11C 5/063
USPC .......................................................... 365/149
See application file for complete search history.

(56) References Cited

U.S. PATENT DOCUMENTS

2003/0128574 A1* 7/2003 Itoh ........................ G11C 11/405 365/149
2013/0336037 A1 12/2013 Chen et al.
2019/0273084 A1* 9/2019 Wang .................... G11C 11/412
2021/0012828 A1* 1/2021 Kim .................... G11C 11/4085
2022/0077151 A1* 3/2022 Lee ...................... H10B 12/482
2022/0122974 A1* 4/2022 Ryu ....................... H10B 12/30
2023/0162768 A1* 5/2023 Lee ....................... G11C 17/16 365/244

FOREIGN PATENT DOCUMENTS

KR 101682666 B1 12/2016
KR 20220094592 A 7/2022

* cited by examiner

*Primary Examiner* — Sung Il Cho
(74) *Attorney, Agent, or Firm* — IP & T GROUP LLP

(57) ABSTRACT

A semiconductor device may include a bit line extending in a third direction, a plurality of active layers extending in a first direction and contacting the bit line, a plurality of word lines extending in a second direction and each disposed at an top surface or bottom surface of each of the plurality of active layers, a plurality of capacitors contacting the plurality of active layers, and a contact formed in at least one active layer disposed at the uppermost part of the bit line, among the plurality of active layers. The bit line and the contact may be electrically connected or separated by using, as a control line, a word line disposed in the top surface or bottom surface of the at least one active layer, among the plurality of word lines.

7 Claims, 7 Drawing Sheets

SEMICONDUCTOR DEVICE HAVING A THREE-DIMENSIONAL STRUCTURE INCLUDING CAPACITORS AND CELL TRANSISTORS

CROSS-REFERENCE TO RELATED APPLICATION

This application claims priority under 35 U.S.C. § 119 to Korean Patent Application No. 10-2023-0112026 filed on Aug. 25, 2023, which is incorporated herein by reference in its entirety.

BACKGROUND

1. Technical Field

Embodiments of the present disclosure relate generally to integrated circuit technology and, more particularly, to semiconductor device technology and applications thereof.

2. Related Art

Recently, as market demand continues to grow for more versatile electronic devices with reduced size, lower power consumption, and higher performance, improved semiconductor devices capable of reliably storing information are needed. The semiconductor devices may be used as storage devices for various electronic devices, such as computers, smartwatch, lap-tops, digital cameras, tablets, portable communication devices, and many other intelligent devices portable or non-portable.

Typically, in two dimensional semiconductor devices, for reducing the size of a semiconductor device and increasing its data storage capacity, various techniques have been developed allowing more memory cells to be integrated in a given size area by reducing a metal line width.

More recently, various methods for manufacturing semiconductor devices having a three-dimensional structure have been proposed because costs associated with manufacturing equipment, investment costs, and development periods have increased exponentially for reducing the metal line width in two dimensional semiconductor devices.

SUMMARY

In an embodiment of the present disclosure, a semiconductor device may include a bit line extending in a third direction, a plurality of active layers extending in a first direction and contacting the bit line, a plurality of word lines extending in a second direction and each being disposed at a top surface or bottom surface of each of the plurality of active layers, a plurality of capacitors contacting the plurality of active layers, and a contact formed in at least one active layer disposed at the uppermost part of the bit line, among the plurality of active layers. The bit line and the contact may be electrically connected or separated by using, as a control line, a word line disposed in the top surface or bottom surface of the at least one active layer, among the plurality of word lines.

In an embodiment of the present disclosure, a semiconductor device may include a plurality of transistors including a plurality of active layers connected between a bit line and a plurality of capacitors and a plurality of word lines each disposed in at least one of a top surface and a bottom surface of each of the plurality of active layers. A transistor disposed at the uppermost part of the bit line, among the plurality of transistors, may be used as a bit line selection switch.

In an embodiment of the present disclosure, a semiconductor device may include a plurality of transistors including a plurality of active layers connected between a bit line and a plurality of capacitors and a plurality of word lines each disposed in at least one of a top surface and a bottom surface of each of the plurality of active layers. A transistor disposed at the uppermost part of the bit line, among the plurality of transistors, may be used as a bit line precharge switch.

These and other features and advantages of the present invention will become better understood from the following drawings and detailed descriptions.

DETAILED DESCRIPTION

Hereinafter, embodiments according to the technical concept of the present disclosure are described with reference to the accompanying drawings.

Various embodiments of the present disclosure provide a semiconductor device having a three-dimensional structure including capacitors and cell transistors arranged in a three-dimensional structure also referred to as stacks.

Figure 1:
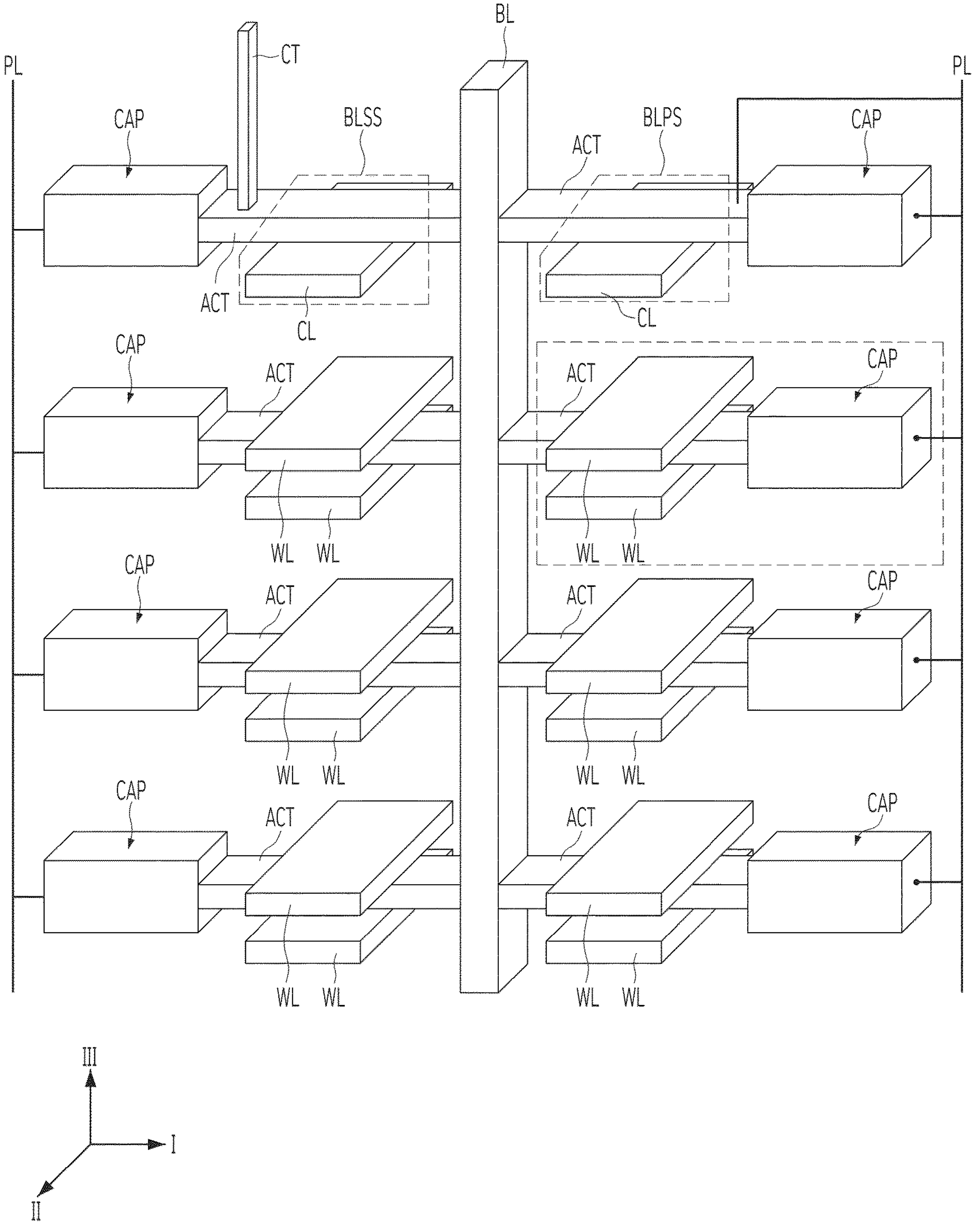
FIG. 1 is a simplified schematic diagram illustrating a semiconductor device according to an embodiment of the present disclosure.
Figure 2:
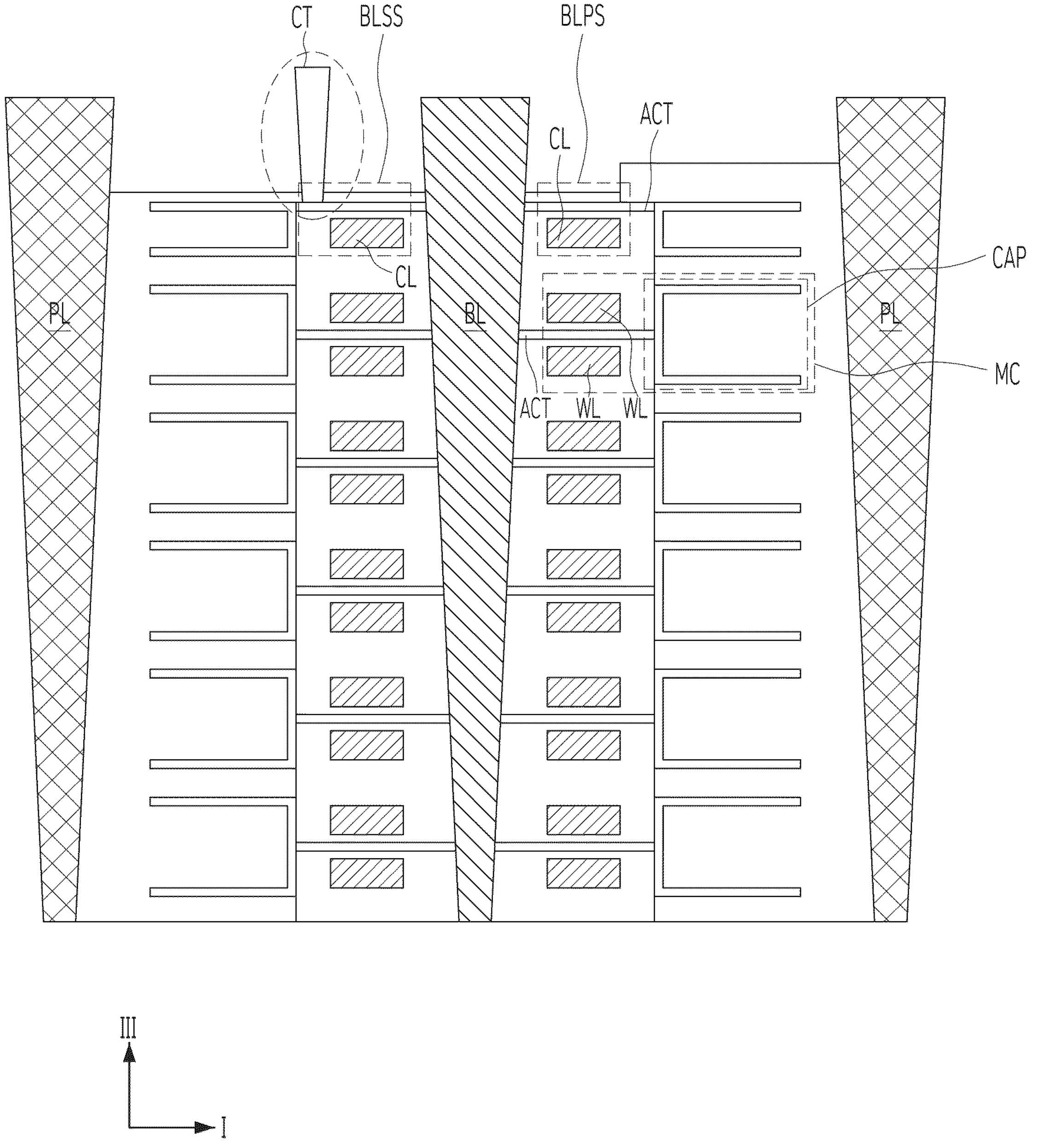
FIG. 2 is a simplified schematic diagram illustrating a semiconductor device according to an embodiment of the present disclosure.

FIGS. 1 and 2 are simplified diagrams illustrating semiconductor devices according to an embodiment of the present disclosure. A third direction III may be a direction orthogonal to a plane defined by first and second directions I and II.

Referring now to FIGS. 1 and 2, the semiconductor device according to an embodiment of the present disclosure may include bit line BL, active layer ACT, word line WL, and capacitor CAP.

The bit line BL may have a pillar shape extending in the third direction III. The third direction may be a vertical direction. For example, the bit line BL may be vertically oriented in the third direction III. Accordingly, the bit line BL may be denoted as a vertically oriented bit line, a vertically extended bit line, or a pillar shape bit line. The bit line BL may include a conductive material. The bit line BL may include, for example, a silicon-base material, a metal-base material, or a combination of a silicon-base material and a metal-base material. The bit line BL may include polysilicon, metal, metal nitride, metal silicide, or a combination of polysilicon, metal, metal nitride, and metal silicide. The bit line BL may include polysilicon, titanium, nitride, tungsten, or a combination of polysilicon, titanium, nitride, and tungsten. For example, the bit line BL may include polysilicon or titanium nitride (TN) into which N type impurities have been doped.

The active layer ACT may contact the bit line BL, and may have a bar shape extending in the first direction I. The active layer ACT may include a semiconductor material or an oxide semiconductor material. For example, the active layer ACT may include silicon, germanium, silicon-germanium, or indium gallium zinc oxide (IGZO). The active layer ACT may include a channel (not illustrated), a first source/drain region (not illustrated), and a second source/drain region (not illustrated).

The word line WL may extend in the second direction II, and may be disposed in at least one of the top surface and bottom surface of the active layer ACT. The word line WL may be disposed in each of the top surface and bottom surface of the active layer ACT. Furthermore, the word line WL may be disposed in one of the top surface and bottom surface of the active layer ACT. The word line WL may include metal, a metal mixture, a metal alloy, or a semiconductor material. For example, the word line WL may include titanium nitride, tungsten, polysilicon, or a combination of titanium nitride, tungsten, and polysilicon.

The capacitor CAP may contact the active layer ACT, and may be horizontally disposed in the first direction I. For example, the capacitor CAP may have one end contacting the active layer ACT, and may have the other end contacting a plate line PL. The construction of the capacitor CAP is described later.

In a semiconductor device according to an embodiment of the present disclosure, a memory cell MC including the word line WL disposed in each of the top surface and bottom surface of the active layer ACT is described. A bit line selection switch BLSS and a bit line precharge switch BLPS, each one including a control line CL disposed under the bottom surface of the active layer ACT contacting the uppermost part of the bit line BL in a direction in which the bit line BL extends, is described in an embodiment. The word line WL and the control line CL may be formed identically except that the word line WL and the control line CL may serve a different functionality and are disposed at different locations. In this case, a contact CT extending in the third direction III may have the active layer ACT between the control line CL of the bit line selection switch BLSS and the capacitor CAP. Furthermore, the bit line precharge switch BLPS may include the plate line PL contacting the active layer ACT between the capacitor CAP and the control line CL.

A semiconductor device according to an embodiment of the present disclosure may be formed to include a bit line BL extending in a vertical direction (i.e., the third direction III); a plurality of active layers ACT contacting the bit line BL and extending in a horizontal direction (i.e., the first direction I); a capacitor CAP contacting each of the plurality of active layers ACT; and a word line WL extending in the second direction II between the bit line BL and each capacitor CAP and disposed in at least one of the top surface and bottom surface of the active layer ACT. In this case, a contact CT may have the active layer ACT disposed at the uppermost part of the bit line BL, so that a transistor of a memory cell MC is used as a bit line selection switch BLSS. Furthermore, the transistor of the memory cell MC may be used as a bit line precharge switch BLPS by connecting the plate line PL to the active layer ACT disposed at the uppermost part of the bit line BL. In this case, each word line WL disposed under the bottom surface of the active layer ACT disposed at the uppermost part of the bit line BL may be named a control line CL.

Figure 3:
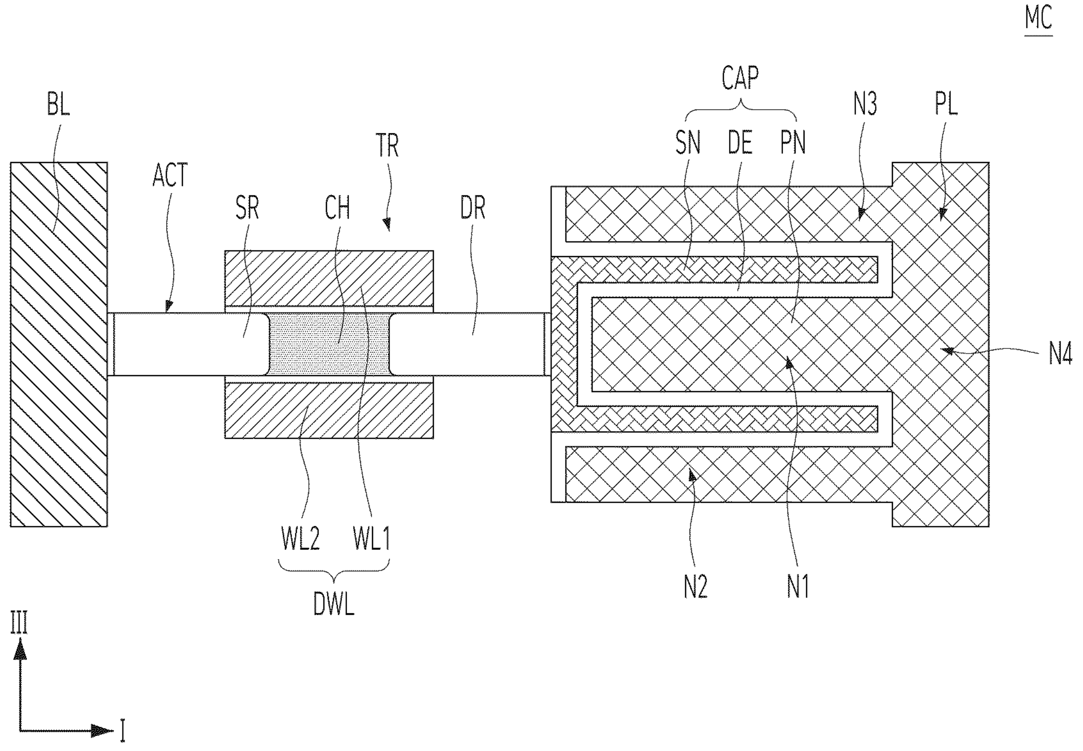
FIG. 3 is a simplified schematic diagram illustrating a memory cell of a semiconductor device according to an embodiment of the present disclosure.

FIG. 3 is a simplified schematic diagram illustrating a memory cell of a semiconductor device according to an embodiment of the present disclosure.

Referring to FIG. 3, a memory cell MC may include a transistor TR and a capacitor CAP.

The transistor TR may include the active layer ACT and the word line WL as a gate of the transistor TR arranged in the first direction from. In this case, the memory cell MC according to an embodiment of the present disclosure may include a pair of word lines WL1 and WL2 that are disposed in the top surface and bottom surface of the active layer ACT, respectively.

The active layer ACT may include a first source/drain region SR, a channel CH, and a second source/drain region DR. The same conductive impurities may be doped into the first source/drain region SR and the second source/drain region DR. N type impurities or P type impurities may be doped into the first source/drain region SR and the second source/drain region DR. A first side of the first source/drain region SR may contact the bit line BL. A second side of the first source/drain region SR may contact the channel CH. A first side of the second source/drain region DR may contact the channel CH. A second side of the second source/drain region DR may contact a storage node SN of the capacitor CAP. Accordingly, the channel CH may be disposed between the first source/drain region SR and the second source/drain region DR.

The pair of word lines WL1 and WL2 may include the first word line WL1 disposed over the top surface of the active layer ACT and the second word line WL2 disposed under the bottom surface of the active layer ACT. In this case, the first and second word lines WL1 and WL2 may be disposed to cover the channel CH, and may partially overlap the first and second source/drain regions SR and DR. The pair of word lines WL1 and WL2 may be denoted as a double word line DWL.

The transistor TR of the memory cell MC constructed as above may be turned on when a difference between the voltage levels of the bit line BL and the pair of word lines WL1 and WL2 is greater than a threshold voltage, and thus may electrically connect the bit line BL and the capacitor CAP. The transistor TR of the memory cell MC may be turned off when a difference between the voltage levels of the bit line BL and the pair of word lines WL1 and WL2 is less than the threshold voltage, and thus may electrically separate the bit line BL and the capacitor CAP.

The capacitor CAP may include the storage node SN, a dielectric layer DE, and a plate node PN. The capacitor CAP may be disposed adjacent to the transistor TR in the first direction I. The storage node SN may be horizontally extended in the first direction I from the active layer ACT. The dielectric layer DE and the plate node PN may be disposed on the storage node SN. The storage node SN, the dielectric layer DE, and the plate node PN may be horizontally arranged in the first direction I. The storage node SN may have a cylinder shape horizontally oriented. The dielectric layer DE may conformally cover inner and outer walls of the cylinder of the storage node SN. The plate node PN may have a shape extending into the inner and outer walls of the cylinder of the storage node SN on the dielectric layer DE. The plate node PN may contact the plate line PL. The storage node SN may electrically contact the second source/drain region DR.

The storage node SN may have a three-dimensional structure. The storage node SN may have a horizontal three-dimensional structure oriented in the first direction I. For example, the storage node SN may have a cylinder shape.

The plate node PN may include an internal node N1 and external nodes N2, N3, and N4. The internal node N1 and the external nodes N2, N3, and N4 may contact each other. The internal node N1 may be disposed within the cylinder of the storage node SN. The external nodes N2 and N3 may be disposed on the outside of the cylinder of the storage node SN with the dielectric layer DE interposed between the external nodes N2 and N3. The external node N4 may connect the internal node N1 and the external nodes N2 and N3 to each other. The external nodes N2 and N3 may be disposed to surround the outer wall of the cylinder of the storage node SN. The external node N4 may play a role as the plate line PL.

The storage node SN and the plate node PN may include metal, precious metal, metal nitride, conductive metal oxide, precious metal oxide, metal carbide, metal silicide, or a combination of metal, precious metal, metal nitride, conductive metal oxide, precious metal oxide, metal carbide, and metal silicide. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-base material and a silicon-base material. For example, the plate node PN may be a titanium nitride/silicon germanium/tungsten nitride (TiN/SiGe/WN) stack. In the titanium nitride/silicon germanium/tungsten nitride (TiN/SiGe/WN) stack, silicon germanium may be a gap-fill material that fills the inside of the cylinder of the storage node SN. Titanium nitride (TiN) may play a role as the plate node PN of the capacitor CAP. Tungsten nitride may be a low-resistance material.

The dielectric layer DE may include silicon oxide, silicon nitride, a high dielectric constant (high-k) material, or a combination of silicon oxide, silicon nitride, and the high-k material. The high-k material may have a higher dielectric constant than silicon oxide. Silicon oxide ($SiO_2$) may have a dielectric constant of about 3.9. The dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may include a complex layer including two or more layers of the aforementioned high-k material.

The dielectric layer DE may be formed of zirconium (Zr)-base oxide. The dielectric layer DE may have a stack structure including zirconium oxide ($ZrO_2$). The stack structure including zirconium oxide ($ZrO_2$) may include a $ZrO_2/Al_2O_3$ (ZA) stack or a $ZrO_2/Al_2O_3/ZrO_2$ (ZAZ) stack. The ZA stack may have a structure in which aluminum oxide ($Al_2O_3$) has been stacked on zirconium oxide ($ZrO_2$). The ZAZ stack may have a structure in which zirconium oxide ($ZrO_2$), aluminum oxide ($Al_2O_3$), and zirconium oxide ($ZrO_2$) have been sequentially stacked. The ZA stack and the ZAZ stack may be denoted as a zirconium oxide ($ZrO_2$)-base layer. In another embodiment, the dielectric layer DE may be formed of hafnium (Hf)-base oxide. The dielectric layer DE may have a stack structure including hafnium oxide ($HfO_2$). The stack structure including hafnium oxide ($HfO_2$) may include a $HfO_2/Al_2O_3$ (HA) stack or a $HfO_2/Al_2O_3/HfO_2$ (HAH) stack. The HA stack may have a structure in which aluminum oxide ($Al_2O_3$) has been stacked on hafnium oxide ($HfO_2$). The HAH stack may have a structure in which hafnium oxide ($HfO_2$), aluminum oxide ($Al_2O_3$), and hafnium oxide ($HfO_2$) have been sequentially stacked. The HA stack and the HAH stack may be denoted as a hafnium oxide ($HfO_2$)-base layer. In the ZA stack, the ZAZ stack, the HA stack, and the HAH stack, aluminum oxide ($Al_2O_3$) may have a greater band gap than each of zirconium oxide ($ZrO_2$) and hafnium oxide ($HfO_2$). Aluminum oxide ($Al_2O_3$) may have a lower dielectric constant than each of zirconium oxide ($ZrO_2$) and hafnium oxide ($HfO_2$).

In an embodiment, if the capacitor CAP has a metal-insulator-metal (MIM) structure, the storage node SN and the plate node PN may each include a metal-base material.

In another embodiment, the capacitor CAP may be substituted with another data storage material. For example, the data storage material may include a phase change material, a magnetic tunnel junction (MTJ), or a variable resistance material.

The memory cell MC constructed as above may electrically connect or separate the bit line BL and the capacitor CAP by a difference between the voltage levels of the bit line BL and the double word line DWL. In an embodiment, after the start of a read or write operation, the bit line BL and the capacitor CAP may be electrically connected.

Figure 4:
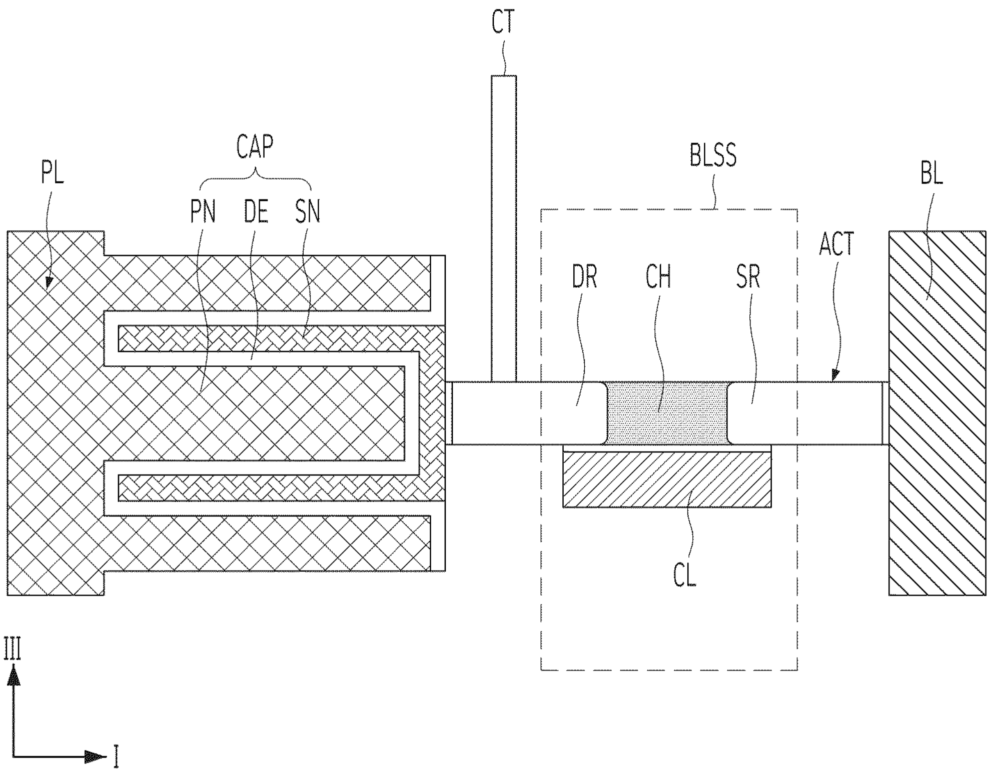
FIG. 4 is a simplified schematic diagram illustrating a bit line selection switch of the semiconductor device according to an embodiment of the present disclosure.

FIG. 4 is a simplified schematic diagram illustrating a bit line selection switch of the semiconductor device according to an embodiment of the present disclosure.

Referring to FIGS. 1 and 2, the bit line selection switch BLSS of the semiconductor device according to an embodiment of the present disclosure may include the active layer ACT contacting the uppermost part of the bit line BL and the control line CL.

Referring to FIG. 4, the active layer ACT included in the bit line selection switch BLSS and contacting the uppermost part of the bit line BL may include a first source/drain region SR, a channel CH, and a second source/drain region DR. A first side of the first source/drain region SR may contact the bit line BL. A second side of the first source/drain region SR may contact the channel CH. A first side of the second source/drain region DR may contact the channel CH. A second side of the second source/drain region DR maycontact the capacitor CAP. In this case, the contact CT extending in the third direction III may be formed in the second source/drain region DR.

The control line CL may be disposed under the bottom surface of the active layer ACT formed at the uppermost part of the bit line BL. In this case, the control line CL may be formed to cover the channel CH, and may partially overlap the first and second source/drain regions SR and DR.

The capacitor CAP may have the same construction as the capacitor CAP illustrated in FIG. 3.

The contact CT may be formed on a source/drain region that contacts the capacitor CAP, among the first and second source/drain regions SR and DR of the active layer ACT. The contact CT may extend in the same direction as the bit line BL, the third direction III. The contact CT may contact a conductive line and a local bit line (not illustrated) that extends in a direction different from the third direction III.

That is, the contact CT may be connected between the second source/drain region DR and the local bit line extending in the direction different from the third direction III.

The bit line selection switch BLSS constructed as above may be turned on or off by a difference between the voltage levels of the first source/drain region SR and the control line CL. When the bit line selection switch BLSS is turned on, the bit line selection switch BLSS may electrically connect the bit line BL and the contact CT. Accordingly, the local bit line connected to the contact CT may be electrically connected to the bit line BL. As a result, the bit line selection switch BLSS turned on may electrically connect the bit line BL vertically oriented and the local bit line. The bit line selection switch BLSS turned off may electrically separate the bit line BL vertically oriented and the local bit line.

Figure 5:
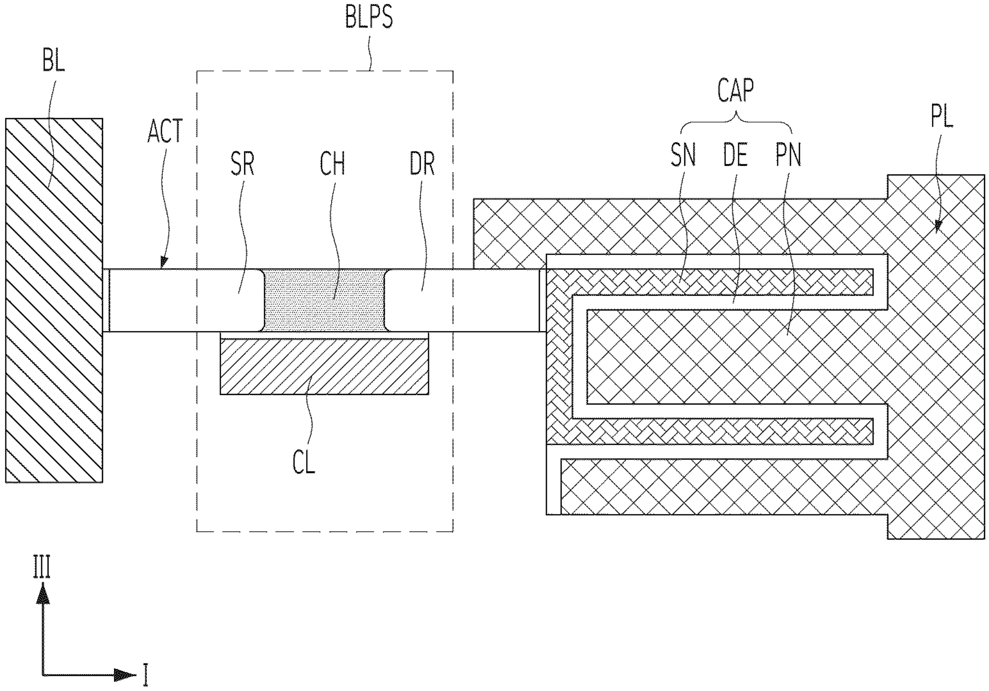
FIG. 5 is a simplified schematic diagram illustrating a bit line precharge switch of the semiconductor device according to an embodiment of the present disclosure.

FIG. 5 is a simplified schematic diagram illustrating a bit line precharge switch of the semiconductor device according to an embodiment of the present disclosure.

Referring to FIGS. 1 and 2, the bit line precharge switch BLPS of the semiconductor device according to an embodiment of the present disclosure may include the active layer ACT connected to the uppermost part of the bit line BL and the control line CL.

Referring to FIG. 5, the active layer ACT included in the bit line precharge switch BLPS and connected to the uppermost part of the bit line BL may include a first source/drain region SR, a channel CH, and a second source/drain region DR. A first side of the first source/drain region SR may contact the bit line BL. A second side of the first source/drain region SR may contact the channel CH. A first side of the second source/drain region DR may contact the channel CH. A second side of the second source/drain region DR may contact the capacitor CAP. In this case, the second source/drain region DR may be electrically connected to the plate line PL. That is, the second source/drain region DR and the plate line PL may partially overlap with each other.

The control line CL may be disposed under the bottom surface of the active layer ACT formed at the uppermost part of the bit line BL. In this case, the control line CL may be formed to cover the channel CH, and may partially overlap the first and second source/drain regions SR and DR.

The capacitor CAP may include a storage node SN, a dielectric layer DE, and a plate node PN. The capacitor CAP may be horizontally disposed in the first direction I. The storage node SN may be horizontally extended in the first direction I from the active layer ACT. The dielectric layer DE and the plate node PN may be disposed on the storage node SN. The storage node SN, the dielectric layer DE, and the plate node PN may be horizontally arranged in the first direction I. The storage node SN may have a cylinder shape horizontally oriented. The dielectric layer DE may conformally cover the inner and outer walls of the cylinder of the storage node SN. The plate node PN may have a shape in which the plate node PN extends to the inner and outer walls of the cylinder of the storage node SN on the dielectric layer DE. Furthermore, the plate node PN may be extended in the first direction I and contact the second source/drain region DR. The plate node PN may contact the plate line PL and the second source/drain region DR. Accordingly, the second source/drain region DR of the active layer ACT may be electrically connected to the plate line PL through the plate node PN.

The bit line precharge switch BLPS constructed as above may be turned on or off by a difference between the voltage levels of the first source/drain region SR and the control line CL. When the bit line precharge switch BLPS is turned on, the bit line precharge switch BLPS may electrically connect the bit line BL and the plate line PL. Accordingly, the bit line precharge switch BLPS that is turned on may precharge the bit line BL with a cell plate voltage VCP supplied to the plate line PL. The bit line precharge switch BLPS when turned off may electrically separate the bit line BL and the plate line PL.

Figure 6:
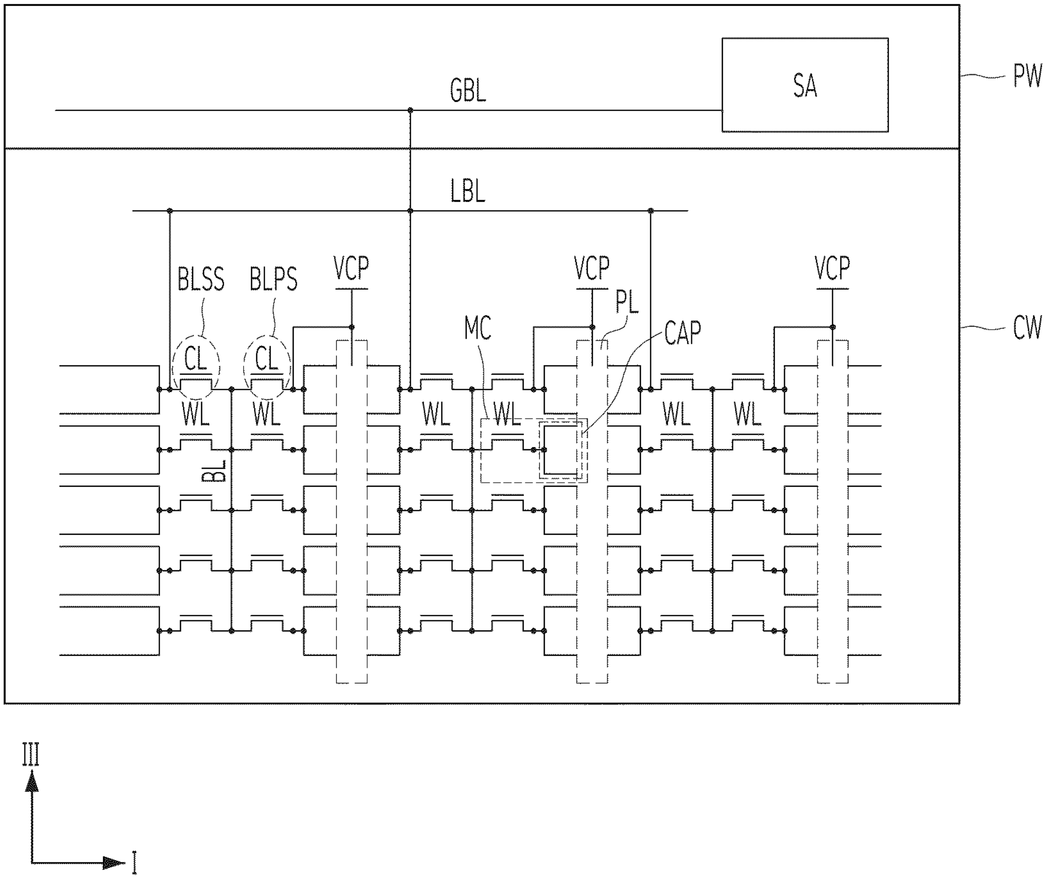
FIGS. 6 and 7 are simplified schematic diagrams illustrating a connection between the semiconductor device according to an embodiment of the present disclosure and another semiconductor device.
Figure 7:

FIGS. 6 and 7 are diagrams for describing a connection between the semiconductor device according to an embodiment of the present disclosure and another semiconductor device.

Referring to FIGS. 6 and 7, a first semiconductor device CW may be a first wafer CW including a plurality of memory cells MC.

A second semiconductor device PW may be a second wafer PW including at least one peripheral circuit, such as a sense amplifier SA.

The first wafer CW may include bit lines BL that have been vertically oriented, and memory cells MC, word lines WL, and at least one local bit line LBL that are contacting the bit line BL vertically oriented. As described above, the first wafer CW may include the bit line selection switches BLSS and the bit line precharge switches BLPS each including the active layer ACT formed at the uppermost part of the bit line BL vertically oriented and the control line CL formed under the bottom surface of the active layer ACT. The bit line selection switches BLSS may be connected to the local bit line LBL through the contact CT. Furthermore, the bit line precharge switches BLPS may be connected to the plate line PL through which the second source/drain region DR is supplied with the cell plate voltage VCP. Accordingly, the bit line selection switches BLSS may selectively connect the local bit line LBL and the bit lines BL that have been vertically oriented. Furthermore, the bit line precharge switches BLPS may selectively precharge the bit lines BL that have been vertically oriented. In this case, the bit line precharge switches BLPS may precharge the level of the bit lines BL that have been vertically oriented to the level of the cell plate voltage VCP.

The first wafer CW and the second wafer PW may be bonded through at least one bonding pad (not illustrated). The local bit line LBL of the first wafer CW may contact a global bit line GBL through the bonding pad. The global bit line GBL may contact the sense amplifier SA. If the bit line selection switches BLSS that selectively connect the local bit line LBL and the bit lines BL that have been vertically oriented are not present, the bit lines BL of the first wafer CW that have been vertically oriented may contact the sense amplifier SA of the second wafer PW by using a large number of bonding pads, and switches that perform the function of the bit line selection switch BLSS need to be formed in the second wafer PW. However, the semiconductor device according to an embodiment of the present disclosure may require a small number of bonding pads when the first and second wafers CW and PW are bonded because the semiconductor device includes the bit line selection switch BLSS that selectively connect, to the local bit line LBL, the bit lines BL that have been vertically oriented.

As a result, the semiconductor device according to an embodiment of the present disclosure may use a transistor, which is provided in at least one memory cell formed at the uppermost part of the bit lines BL that have been vertically oriented, as the bit line selection switch BLSS that selectively connect, to the local bit line LBL, the bit lines BL that have been vertically oriented.

Furthermore, the semiconductor device according to an embodiment of the present disclosure may use a transistor, which is provided in at least one memory cell formed at the uppermost part of the bit lines BL that have been vertically oriented, as the bit line precharge switch BLPS that selectively precharges the bit lines BL that have been vertically oriented with the cell plate voltage VCP.

In FIG. 6, the structure in which the second wafer PW is disposed on the first wafer CW has been described. However, as illustrated in FIG. 7, even the structure in which the first wafer CW is disposed on the second wafer PW may be used in an embodiment of the present disclosure. In an embodiment, FIG. 7 may be the structure in which the components or structures in FIG. 6 have been reversed up and down.

Although embodiments according to the technical concept of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical concept of the present disclosure written in the claims. Such substitutions, modifications, and changes may be said to belong to the scope of the present disclosure. Furthermore, the embodiments may be combined to form additional embodiments.

What is claimed is:

1. A semiconductor device comprising:

a plurality of transistors connected to a plurality of word lines including a plurality of active layers;

a plurality of memory cells including a plurality of capacitors connected to a bit line through the plurality of active layers respectively extending in a first direction; and the bit line extending in a second direction;

a control transistor connected to a control line being an uppermost transistor among the plurality of transistors and including a control active layer, wherein a contact is formed over the control active layer, and wherein the contact is disposed between the control line and a capacitor connected to the control transistor.

2. The semiconductor device of claim 1, wherein the first direction is a direction orthogonal to the second direction.

3. The semiconductor device of claim 1, wherein:

each of the plurality of capacitors comprises a storage node, a dielectric layer, and a plate node, and the storage node has a cylinder shape and is horizontally contacting the active layer, the dielectric layer is formed to cover inner and outer walls of the cylinder of the storage node, and the plate node is extended to the inner and outer walls of the cylinder on the dielectric layer.

4. The semiconductor device of claim 1, wherein the control transistor is used to a bit line precharge switch connected to the bit line and the plate node based on the control line.

5. The semiconductor device of claim 1, wherein the contact is connected to a local bit line and the control transistor is used as a bit line selection switch connected the bit line to the contact based on the control line.

6. The semiconductor device of claim 1, wherein the plurality of word lines, the plurality of capacitors, the bit line and the control line are formed in a cell wafer, wherein a sense amplifier is formed in a peripheral wafer, and wherein the cell wafer and the peripheral wafer are different each other.

7. The semiconductor device of claim 6, wherein the cell wafer and the peripheral wafer are bonded together using at least one bonding pad.

* * * * *